(12) United States Patent
Bosshard et al.

(10) Patent No.: US 7,924,009 B2
(45) Date of Patent: Apr. 12, 2011

(54) ANTENNA ARRANGEMENT FOR A MAGNETIC RESONANCE APPARATUS

(75) Inventors: John Bosshard, Temple, TX (US); Martin Hemmerlein, Bamberg (DE)

(73) Assignee: Siemens Aktiengesellschaft, Munich (DE)

( * ) Notice: Subject to any disclaimer, the term of this patent is extended or adjusted under 35 U.S.C. 154(b) by 119 days.

(21) Appl. No.: 12/393,221

(22) Filed: Feb. 26, 2009

(65) Prior Publication Data

US 2009/0212774 A1 Aug. 27, 2009

(30) Foreign Application Priority Data

Feb. 26, 2008 (DE) .................... 10 2008 011 144

(51) Int. Cl.
*G01V 3/00* (2006.01)

(52) U.S. Cl. ........................................ 324/318; 324/322

(58) Field of Classification Search .................. 324/318, 324/322

See application file for complete search history.

(56) References Cited

U.S. PATENT DOCUMENTS

| 6,534,983 | B1 * | 3/2003 | Boskamp et al. ............. 324/318 |
| 7,394,253 | B2 * | 7/2008 | Okamoto et al. ............. 324/318 |
| 7,501,827 | B2 * | 3/2009 | Ishii et al. .................... 324/322 |
| 2004/0124840 | A1 | 7/2004 | Reykowski | |
| 2007/0085634 | A1 | 4/2007 | Du et al. | |

* cited by examiner

*Primary Examiner* — Louis M Arana
(74) *Attorney, Agent, or Firm* — Schiff Hardin LLP

(57) ABSTRACT

In an antenna arrangement for a magnetic resonance apparatus and a method for acquiring magnetic resonance signals, which has at least four individually operable antenna conductor loops arranged like a matrix in rows and columns, wherein two antenna conductor loops adjacent in a row or in a column are inductively decoupled from one another; and wherein two antenna conductor loops diagonally adjacent to one another in adjacent rows and columns are capacitively decoupled from one another.

11 Claims, 2 Drawing Sheets

ANTENNA ARRANGEMENT FOR A MAGNETIC RESONANCE APPARATUS

BACKGROUND OF THE INVENTION

1. Field of the Invention

The present invention concerns an antenna arrangement for a magnetic resonance apparatus of the type having at least four individually operable antenna conductor loops arranged like a matrix in rows and columns, wherein two antenna conductor loops adjacent in a row or in a column are inductively decoupled from one another. Moreover, the invention concerns a method to measure magnetic resonance signals with such an antenna arrangement.

2. Description of the Prior Art

In a magnetic resonance examination of specific organs or body parts of a patient, antennas known as surface antennas are used to acquire the magnetic resonance signals (MR signals). In the examination these surface antennas are arranged relatively close to the organ or body part to be examined, advantageously directly on the body surface of the patient. In contrast to antennas arranged remote from the patient that are normally used to generate an entire slice image through a patient, these surface antennas consequently have the advantage that they are arranged closer to the regions of interest, and therefore have a greater fill factor. The usable signal is thereby less attenuated and the component portion caused by electrical losses within the body of the patient is thereby reduced, meaning that the signal-to-noise ratio (SNR) of a surface antenna is in principle better than that of a more remote antenna. However, it is disadvantageous that a single surface antenna is able to generate an effective image only within a specific spatial expanse that lies in the range of the diameter of the conductor loop of the surface antenna. The usage possibilities for such individual surface antennas therefore are very limited due to the limited observation region (field of view). The observation region can be expanded by enlarging the diameter of the conductor loop of the surface antenna, but an increase of the electrical losses in the body of the patient, and therefore attendant greater noise, is associated with the enlargement of the conductor loop. With the use of a single surface antenna, a middle path must therefore be chosen between optimally good resolution and an optimally large observation region. One possibility to enlarge the observation region without reducing the resolution to the same degree is to use a field of smaller surface antennas arranged adjacent to one another, for example the aforementioned antenna arrangement with multiple individually operable antenna conductor loops arranged like a matrix in rows and columns, which antenna conductor loops form a large surface antenna.

One problem in the use of such an antenna arrangement with multiple adjacent antenna conductor loops is that a radio-frequency current in one antenna conductor loop can induce a voltage in an adjacent antenna conductor loop. This is typically referred to inductive coupling of the antenna conductor loops. The inductive coupling leads to the situation that a signal generated in one of the adjacent conductor loops automatically also causes a signal component in the adjacent antenna conductor loop. The inductive coupling consequently impairs the signal-to-noise ratio. The outlay for evaluation of the signals of coupled antenna conductor loops is larger in the case of uncoupled antenna conductor loops. Inductive coupling of the antenna conductor loops therefore should optimally be avoided.

One possibility to decouple adjacent antenna conductor loops is to arrange the adjacent conductor loops so as to overlap to a specific degree, so that the inductive coupling between the appertaining antenna conductor loops is minimal overall.

Such a "geometric" or "inductive" decoupling is possible without further measures for antenna conductor loops that lie immediately adjacent to one another within a row or column of the antenna arrangement. The decoupling of conductor loops that adjoin one another diagonally in adjacent rows and columns is problematic. In order to achieve geometric decoupling between these conductor loops, the geometry of the conductor loops would have to be significantly altered, causing the antenna characteristic to be significantly affected. An overlap of the diagonally adjacent coils would also lead to a larger central region being simultaneously covered by four coils. This leads to an unwanted signal increase in this region, which among other things can lead to image artifacts.

In practice, surface antennas are therefore generally used in which the conductor loops diagonally adjacent to one another are not decoupled at all within the antenna arrangement, but rather in which it is sought to achieve as good a decoupling as possible merely by a sufficient distance between the conductors of the diagonally adjacent antenna conductor loops and by suitable decoupling of the preamplifiers arranged at the antenna terminals.

Such an arrangement according to the prior art is shown in FIG. 1. Therein, four conductor loops $L_1$, $L_2$, $L_3$, $L_4$ are arranged like a matrix relative to one another redundancy information an antenna arrangement. The signals acquired by means of the antenna conductor loops $L_1$, $L_2$, $L_3$, $L_4$ are respectively tapped via the terminals A and transmitted via preamplifiers to the components processing the signals further. An inductive decoupling via a suitable overlap U of the respective antenna conductor loops $L_1$, $L_2$, $L_3$, $L_4$ is achieved between the respective conductor loops $L_1$, $L_2$, $L_3$, $L_4$ directly adjacent a row or column. In contrast to this, a greater separation is maintained between two respective antenna conductor loops $L_1$, $L_2$, $L_3$, $L_4$ diagonal to one another. As FIG. 1 shows, this leads to the situation that the central region Z is not covered by the antenna conductor loops $L_1$, $L_2$ $L_3$, $L_4$, which is likewise not optimal.

In order to achieve a decoupling of diagonal elements, in some antenna arrangements external conductor structures shaped like butterfly wings and lying at a free potential are used, with these conductor structures being dimensioned, and attached in the diagonals by the diagonally adjacent antenna conductor loops, so that the magnetic flux that couples the conductor loops situated diagonally relative to one another is increased again. This leads to the situation, however, of an increased copper requirement exists for the additional conductor loops, which in turn reduces the quality factor of the entire antenna arrangement and the mechanical resilience, in particular for flexible coils.

SUMMARY OF THE INVENTION

An object of the present invention is to further develop an antenna arrangement of the aforementioned type and a corresponding method to measure magnetic resonance signals such that a decoupling of two diagonally adjacent antenna conductor loops is also possible in a cost-effective and simple manner.

The above object is achieved in accordance with the present invention by an antenna arrangement for a magnetic resonance apparatus having at least four individually operable antenna conductor loops arranged in a matrix in rows and columns, wherein two of the antenna conductor loops that are adjacent in a row or in a column are inductively decoupled from each other, and wherein two antenna conductor loops that are diagonally adjacent in adjacent rows and columns are capacitively decoupled from each other.

According to the invention, it is ensured that two antenna conductor loops diagonally adjacent to one another in adjacent rows and columns are capacitively decoupled from one another.

A particularly cost-effective and optimal design of surface antenna arrangements is achieved by the insightful combination according to the invention of inductive decoupling of the conductor loops immediately adjacent to one another in a row or column and the capacitive decoupling of conductor loops lying diagonal to one another in adjacent rows and columns. These antenna arrangements thus can be produced simply on two opposite sides of a conductor trace film with typical printing or etching methods since, in principle, no additional external conductor loop elements are required at all, nor is quadruple overlap of individual antenna conductor loops required.

By foregoing inductive decoupling of diagonally situated antenna conductor loops, there are also no geometric regions that are detected by more than two antenna conductor loops, which could lead to an unwanted signal increase. Nevertheless, no complicated and expensive decoupling of the signal preamplifiers is necessary in order to compensate for an unintended decoupling of diagonally adjacent coils.

The simplified design additionally results in an increased mechanical stability and robustness of the surface antennas, which is of significant value in practical use of these elements.

The above object also is achieved in accordance with the present invention by a method for detecting or acquiring magnetic resonance signals with an antenna arrangement, including the steps of arranging at least four individually operable antenna conductor loops in a matrix in rows and columns, inductively decoupling two antenna conductor loops from each other that are adjacent in a row or in a column, and capacitively decoupling two antenna loops from each other that are diagonally adjacent in rows and columns.

Such an antenna arrangement can in principle be used in the most varied types of magnetic resonance antenna systems. As explained above, the antenna arrangement is preferably used as a surface antenna that is placed directly on or at least near to the body of the patient or, respectively, test subject. This advantageously relates to antenna arrangements in which all antenna conductor loops are arranged in one antenna plane or in conductor trace layers arranged flat atop one another, advantageously on different sides of a foil or the like. The application on a foil has the advantage that the antenna arrangement is flexible to a certain extent. In principle, however, the invention can also be used in specially shaped antenna systems, for example in a head coil or a whole-body coil.

The antenna arrangement can additionally be used not only to acquire magnetic resonance signals but also to emit radio-frequency signals in order to stimulate the generation of magnetic resonance signals.

Inductive decoupling of two adjacent antenna conductor loops situated next to one another in a row or column is possible in various ways; in principle additional external conductor loops (for example conductor loops shaped like butterfly wings) could also be used here which again compensate for the magnetic flux currents incurred for a coupling of adjacent antenna conductor loops. However, the inductive decoupling advantageously ensues in that two adjacent antenna conductor loops arranged in a row or a column overlap to a specific extent. This extent or the overlap area is selected so that overall the inductive coupling is minimal between the appertaining antenna conductor loops is minimal. An inductive decoupling can be achieved with the least effort in this way.

In order to capacitively decouple two antenna conductor loops diagonally adjacent to one another from one another in a simple manner, these can each have a discontinuity, with the discontinuities being electrically connected in parallel and being bridged with a capacitive element. The voltage induced in the conductor loops by the overcoupling is compensated via this coupling capacitance. Such a capacitive decoupling of two adjacent conductor loops is known to those skilled in the art (for example from DE 40 38 106 A1) and does not need to be explained further herein.

In a particularly simple and cost-effective embodiment, the antenna conductor loops are each fashioned so that two diagonally adjacent antenna conductor loops have a common conductor loop section that has a discontinuity that is bridged with a capacitive element. This means that antenna conductor loops situated diagonally can directly adjoin one another and require only a common boundary conductor loop section which is simply interrupted at one point and populated with a suitable capacitance. in this design, the entire region above or below the antenna array is detected by respectively at least one antenna conductor loop. This design can additionally be achieved with a minimal copper expenditure, which in turn increases the quality factor of the entire antenna arrangement.

The conductor loops are thereby advantageously fashioned so that they essentially circumscribe an octagonal area. The arrangement of the conductor loops can then ensue so that one of the eight sides forms the common boundary conductor loop section of two diagonally adjacent antenna conductor loops. It is thereby also automatically assured that the respective antenna conductor loops located next to one another in a row or column partially overlap. How large the overlap areas are can be determined by the precise measurements of the octagonal area in order to thus achieve the matching inductive decoupling between the antenna conductor loops immediately adjacent in a column or row.

However, depending on the precise application and design of the additional components of the antenna arrangement the conductor loops can in principle also exhibit an arbitrarily different shape (for example a circular shape, an elliptical shape, a quadratic shape, a simple rectangular shape or an arbitrary polygonal shape).

DESCRIPTION OF THE PREFERRED EMBODIMENTS

Figure 1:
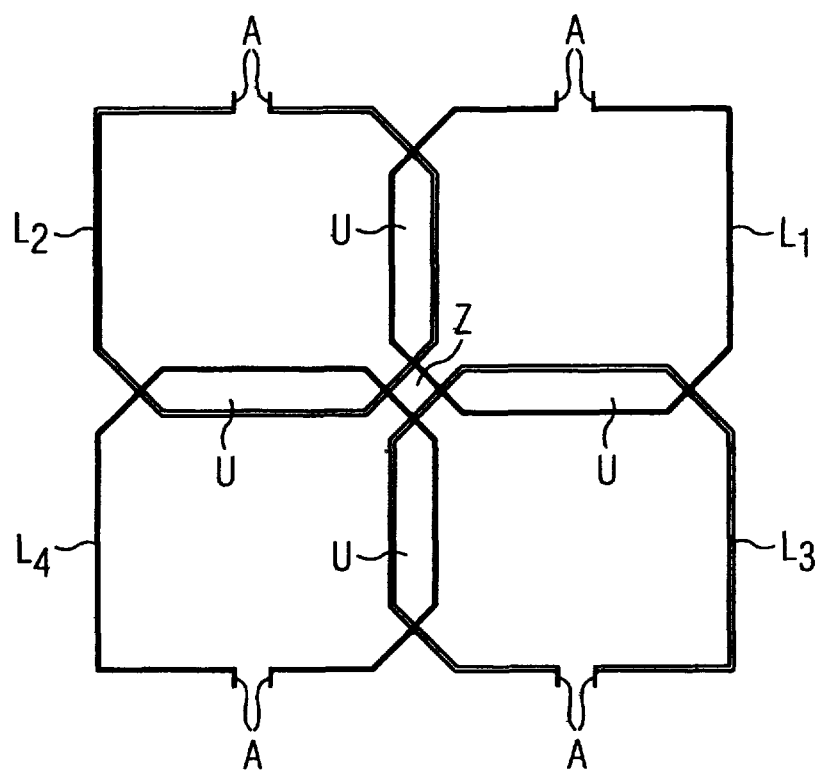
FIG. 1 schematically illustrates an antenna arrangement with four antenna conductor loops according to the prior art.

The design of a typical surface antenna arrangement according to the prior art that is shown in FIG. 1 with four antenna conductor loops $L_1$, $L_2$, $L_3$, $L_4$ arranged in the shape of a matrix was already explained above. As can be seen, the antenna conductor loops $L_1$, $L_2$, $L_3$, $L_4$ immediately adjacent to one another in a row or column are inductively decoupled from one another via a suitably selected geometric overlap U. A specific separation is maintained between respective antenna conductor loops $L_1$, $L_2$, $L_3$, $L_4$ diagonally opposite one another in the matrix in order to optimally avoid an overcoupling. A central region Z that is not covered by the antenna conductor loops $L_1$, $L_2$, $L_3$, $L_4$ thereby arises. An overcoupling can also additionally only be entirely prevented with difficulty, such that significant measures are necessary at the signal preamplifiers in order to achieve the signal decoupling.

Figure 2:
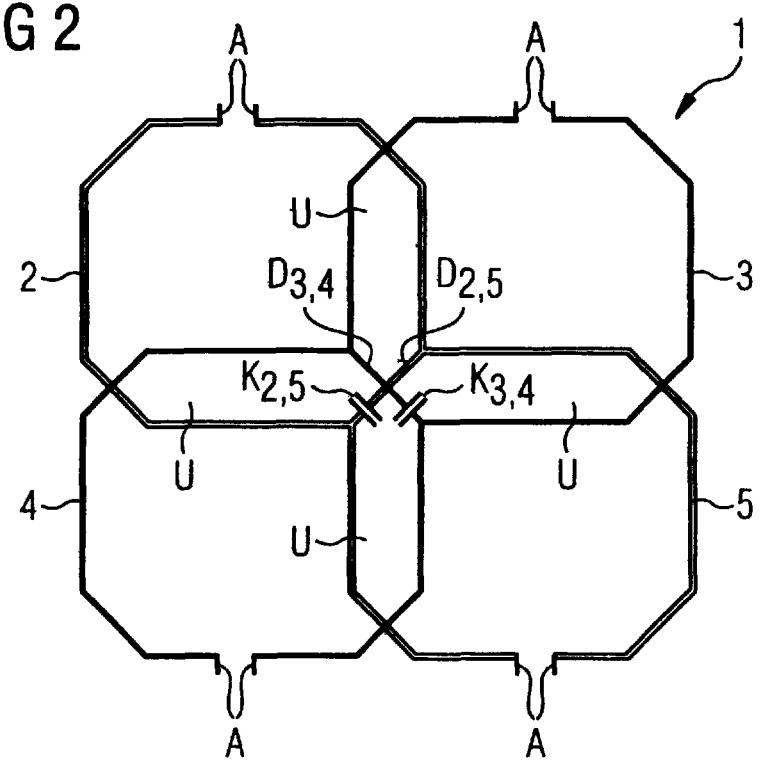
FIG. 2 schematically illustrates a first exemplary embodiment of an antenna arrangement according to the invention, with four antenna conductor loops.

In contrast to this, FIG. 2 shows a very simple exemplary embodiment for an antenna arrangement 1 according to the invention. This antenna arrangement 1 also comprises four antenna conductor loops 2, 3, 4, 5. The individual antenna conductor loops 2, 3, 4, 5 here have an octagonal course, meaning that they circumscribe an octagonal footprint. However, it is noted that the individual antenna conductor loops do not necessarily have to exhibit the preferred octagonal course shown in FIG. 2; rather, they can also exhibit another shape, for example the basic shape shown in FIG. 1.

All antenna conductor loops 2, 3, 4, 5 can be operated independent of one another. The signals acquired by the individual antenna conductor loops 2, 3, 4, 5 are respectively tapped at the terminals A and directed to suitable signal preamplifiers. The mode of operation of such antenna arrangements 1 or, respectively, of the signal preamplifiers, and the additional processing of the magnetic resonance signals acquired with such an antenna arrangement 1, are known in principle to those skilled in the art and therefore do not need to be explained further here.

In contrast to the design according to the prior art that is presented in FIG. 1, here the antenna conductor loops 2, 3, 4, 5 are arranged relative to one another so that the diagonally opposite antenna conductor loops 2, 5, or 3, 4, directly adjoin one another, and one edge of the octagonal antenna conductor loops 2, 3, 4, 5 is thereby a common boundary conductor loop section $D_{3,4}$, $D_{2,5}$, of the respective diagonally opposite antenna conductor loops 2, 5 or, respectively, 3, 4. This common boundary conductor loop sections $D_{3,4}$, $D_{2,5}$, each have a discontinuity that is bridged by a capacitance $K_{2,5}$, $K_{3,4}$, for example a capacitor with the matching capacitance value. A capacitive decoupling of the respective antenna conductor loops 2, 5, or 3, 4, arranged diagonally relative to one another is hereby achieved.

With this geometric arrangement it is simultaneously achieved that the respective antenna conductor loops 2, 3, 4, 5 directly adjacent in a row or column possess precisely defined overlap regions U via which these antenna conductor loops are inductively decoupled from one another. Overall, all four antenna conductor loops 2, 3, 4, 5 are thus decoupled from one another and can be operated separately from one another.

Such an antenna arrangement 1 can advantageously be generated on a single conductor trace foil in that the conductor loops 2, 5 or, respectively, 3, 4 situated diagonally relative to one another are respectively applied on a respective side of the conductor trace foil. Additional layers are not necessary for this. Additional more voluminous or more cost-intensive elements are also not required in order to produce a decoupling.

Figure 3:
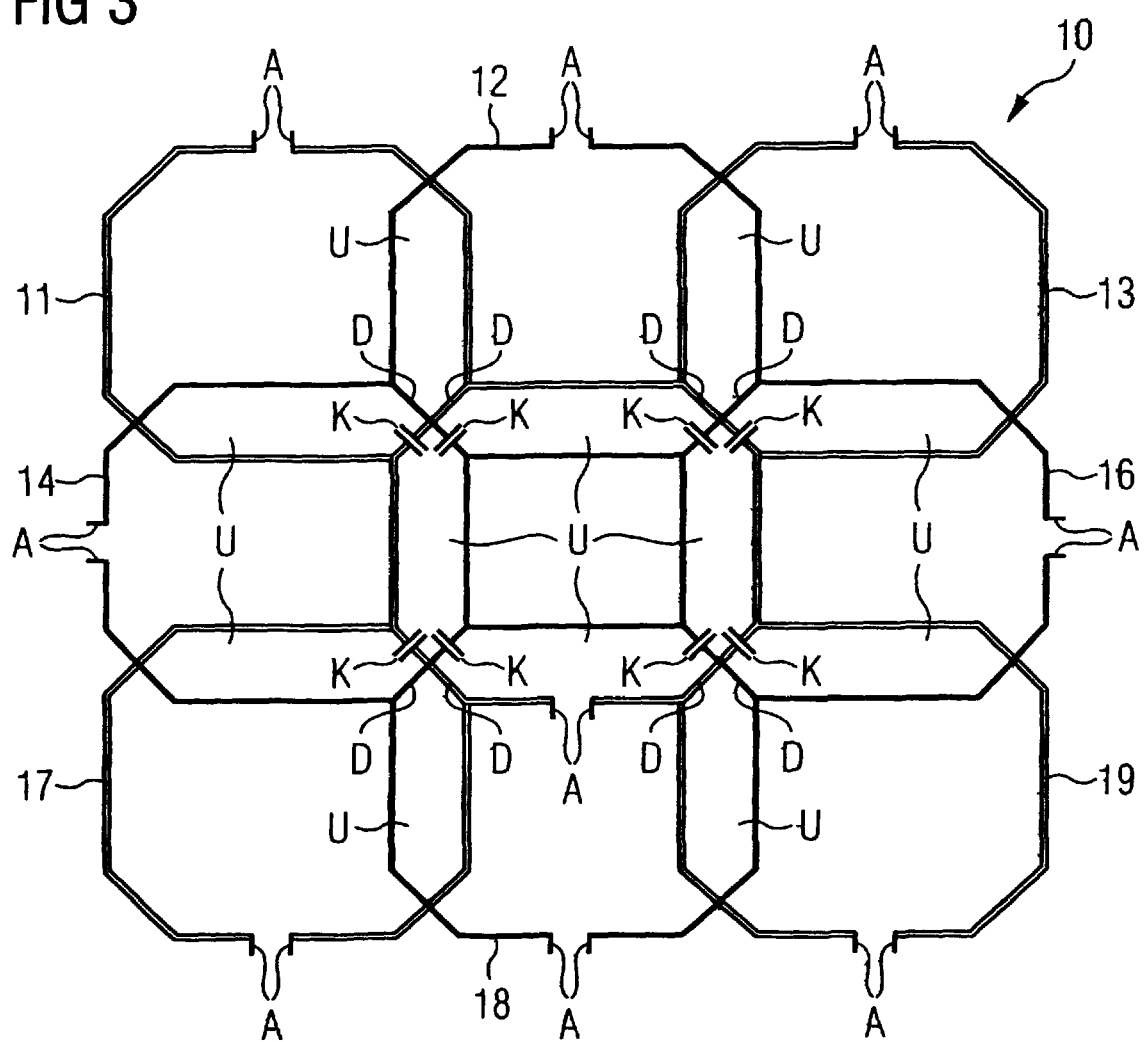
FIG. 3 schematically illustrates a second exemplary embodiment of an antenna arrangement according to the invention, with nine antenna local coils.

FIG. 3 shows an exemplary embodiment of an antenna arrangement 10 according to the invention, with more than four individual antenna conductor loops, namely here in total nine antenna conductor loops 11, 12, 13, 14, 15, 16, 17, 18, 19. These antenna conductor loops 11, 12, 13, 14, 15, 16, 17, 18, 19 also possess respective terminals A at which the signals of the antenna conductor loops 11, 12, 13, 14, 15, 16, 17, 18, 19 can be tapped. The antenna conductor loops 11, 12, 13, 14, 15, 16, 17, 18, 19 are again respectively separately operable.

The design of the individual antenna conductor loops 11, 12, 13, 14, 15, 16, 17, 18, 19 is thereby in principle similar to the design according to FIG. 2. Here as well the antenna conductor loops 11, 12, 13, 14, 15, 16, 17, 18, 19 respectively possess an octagonal course. For this it is thereby provided that all antenna conductor loops 11, 13, 15, 17, 19 or, respectively, 12, 14, 16, 18 arranged diagonally relative to one another adjoin a diagonally adjacent antenna conductor loop on one side of the octagon, and the boundary line is used as a common boundary conductor loop section of the two respective diagonally adjacent antenna conductor loops 11, 13, 15, 17, 19 or, respectively, 12, 14, 16, 18. These common boundary conductor loop sections D each again has a discontinuity that is bridged by a capacitive element K which ensures a decoupling of the diagonally adjacent antenna conductor loop 11, 13, 15, 17, 19, or 12, 14, 16, 18. With regard to the respective antenna conductor loops directly adjacent in the same row or column, the decoupling ensues in the conventional manner via a geometric overlap U.

From FIG. 3 it is apparent that an arbitrary number of antenna conductor loops can be coupled to the desired antenna arrangement in this manner, wherein all diagonal elements can be capacitively decoupled from one another in the manner according to the invention, and all antenna elements adjacent in a row or column can be decoupled from one another via a geometric overlap.

From FIG. 3 it can be seen that a nearly arbitrarily large antenna arrangement with an arbitrary number of individual antenna conductor loops can also be realized on a simple conductor trace foil. For this purpose, all diagonally adjacent antenna conductor loops can be arranged in the shown honeycomb arrangement on one side of the conductor trace foil, and the honeycomb arrangement of the additional antenna conductor loops can ensue in the same manner (but offset by precisely one comb field) on the back side of the conductor trace foil. By the overlapping of the honeycomb-like arrangements on the front side and back side, overall a matrix-shaped arrangement of the antenna conductor loops with the desired overlap regions U is generated for inductive decoupling of antenna conductor loops immediately adjacent in a row or column and the capacitive decoupling of the diagonally adjacent antenna conductor loops.

It should be noted that all antenna conductor loops should be inductively (or in the diagonals, capacitively) decoupled from one another in the preferred embodiments. However, in principle it is not precluded, if desired for specific applications, to also design antenna arrangements in which only specific antenna conductor loops are decoupled from one another in the manner according to the invention, and in contrast to this other antenna conductor loops are decoupled in a different manner or—insofar as this is desired—even not at all.

In principle, the invention can be designed with antenna conductor loops of arbitrary size. However, it has turned out that two size ranges are preferable.

In a preferred exemplary embodiment, the conductor loops possess a diameter between 14 cm and 18 cm. For example, in the exemplary embodiment shown in FIG. 1 with the antenna arrangement 1 possessing only four antenna conductor loops 2, 3, 4, 5, the antenna conductor loops 2, 3, 4, 5 respectively exhibit a diameter of approximately 15 cm in the horizontal or vertical direction. In a further preferred variant, the octagonal antenna conductor loops has a diameter of approximately 15 cm in one direction and a diameter of approximately 17 cm in the other direction.

In an additional particularly preferred exemplary embodiment, antenna conductor loops are used that possess a diameter between 7 cm and 10 cm. This is particularly the case when a higher number of antenna conductor loops is used in the antenna arrangement, for example as in the design according to FIG. 3. An antenna conductor loop is preferably used that respectively has a diameter of 9 cm in the horizontal or vertical direction.

According to the invention, the diagonally adjacent antenna conductor loops 2, 5 or, respectively, 3, 4 are decoupled with a suitable capacitive element $K_{2,5}$, $K_{3,4}$, K. The matching value for the capacitive element $K_{2,5}$, $K_{3,4}$, K depends not only on the size but also on the resonance frequency of the antenna arrangement, i.e. in which resonance range the antenna should acquire magnetic resonance signals.

The capacitance advantageously has a value between 10 pF and 22 pf, in particular in the cited preferred exemplary embodiments with antenna conductor loops with a diameter between 14 cm and 18 cm or with a diameter between 7 cm and 10 cm given use of the antenna arrangement for a resonance frequency of 123 MHz (as is necessary in magnetic resonance apparatuses with 3 Tesla basic magnetic field for typical proton imaging). In contrast to this, if the antenna arrangement is used for measurement at a resonance frequency of 63 MHz (as is necessary in magnetic resonance apparatuses with 3 Tesla basic magnetic field strength for proton imaging), the capacitance is advantageously between 40 pF and 60 pF.

As is clear from the exemplary embodiments shown in FIGS. 2 and 3 and explained above, the design according to the invention makes it possible to produce arbitrarily large antenna arrangements in a very simple and effective manner which possess a very good decoupling of all adjacent antenna-conductor loops relative to one another. The designs described in the preceding are only exemplary embodiments, the basic principle of the decoupling can be varied in wide ranges without departing from the scope of the invention.

Although modifications and changes may be suggested by those skilled in the art, it is the intention of the inventors to embody within the patent warranted hereon all changes and modifications as reasonably and properly come within the scope of their contribution to the art.

We claim as our invention:

1. An antenna arrangement for a magnetic resonance apparatus, comprising:
   at least four individually operable antenna conductor loops arranged in a matrix in rows and columns;
   two of said antenna conductor loops that are adjacent in a row or adjacent in a column being inductively decoupled from each other; and
   two of said antenna conductor loops that are diagonally adjacent in adjacent rows and adjacent columns being capacitively decoupled from each other by having a common boundary conductor loop section with a discontinuity therein bridged with a capacitive element.

2. An antenna arrangement as claimed in claim 1 wherein two of said antenna conductor loops that are adjacent in a row or adjacent in a column at least partially overlap each other.

3. An antenna arrangement as claimed in claim 1 wherein each capacitive element has a capacitance in a range between 10 pF and 22 pF in an antenna conductor loop for a resonance frequency of 123 mHz.

4. An antenna arrangement as claimed in claim 1 wherein each capacitive element has a capacitance in a range between 40 pF and 60 pF in an antenna conductor loop for a resonance frequency of 63 mHz.

5. An antenna arrangement as claimed in claim 1 wherein each capacitive element has a capacitance in a range between 10 pF and 22 pF in an antenna conductor loop for a resonance frequency of 123 mHz.

6. An antenna arrangement as claimed in claim 1 wherein each capacitive element has a capacitance in a range between 40 pF and 60 pF in an antenna conductor loop for a resonance frequency of 63 mHz.

7. An antenna arrangement as claimed in claim 1 wherein said antenna conductor loops have a diameter in a range between 14 cm and 18 cm.

8. An antenna arrangement as claimed in claim 1 wherein said antenna conductor loops have a diameter in a range between 7 cm and 10 cm.

9. An antenna arrangement as claimed in claim 1 wherein each of said antenna conductor loops essentially circumscribes an octagonal area.

10. A magnetic resonance apparatus comprising:
    a magnetic resonance data acquisition device configured to acquire magnetic resonance data from an examination subject therein, said magnetic resonance data acquisition device comprising a basic field magnet having an examination volume therein in which the patient is located, a gradient coil system that generates gradient fields in said examination volume, and an antenna arrangement for transmitting or receiving RF signals into and from said examination volume; and
    said antenna arrangement comprising at least four individually operable antenna conductor loops arranged in a matrix in rows and columns, two of said antenna conductor loops that are adjacent in a row or adjacent in a column being inductively decoupled from each other, and two of said antenna conductor loops that are diagonally adjacent in adjacent rows and adjacent columns being capacitively decoupled from each other by having a common boundary conductor loop section with a discontinuity therein bridged with a capacitive element.

11. A method for acquiring magnetic resonance signals with an antenna arrangement, comprising the steps of:
    forming an antenna arrangement by arranging four individually operable antenna conductor loops in a matrix in rows and columns;
    inductively decoupling two of said conductor loops from each other that are adjacent in a row or a adjacent in a column; and
    capacitively decoupling two of said antenna conductor loops from each other that are diagonally adjacent in adjacent rows and adjacent columns by providing said two of said antenna conductor loops that are diagonally adjacent with a common boundary conductor loop section having a discontinuity therein bridged with a capacitive element.

* * * * *